(12) United States Patent
Lin et al.

(10) Patent No.: US 6,576,407 B2
(45) Date of Patent: Jun. 10, 2003

(54) METHOD OF IMPROVING ASTIGMATISM OF A PHOTORESIST LAYER

(75) Inventors: Shun-Li Lin, Yun-Lin Hsiang (TW); Wei-Hua Hsu, Tai-Chung (TW)

(73) Assignee: Macronix International Co. Ltd., Hsin-Chu (TW)

( * ) Notice: Subject to any disclaimer, the term of this patent is extended or adjusted under 35 U.S.C. 154(b) by 162 days.

(21) Appl. No.: 09/840,996

(22) Filed: Apr. 25, 2001

(65) Prior Publication Data

US 2002/0160314 A1 Oct. 31, 2002

(51) Int. Cl.⁷ .................................................. G03F 7/20
(52) U.S. Cl. ....................... 430/322; 430/290; 430/311; 430/313; 430/396
(58) Field of Search ............................. 430/1, 311, 313, 430/322, 396, 290

(56) References Cited

U.S. PATENT DOCUMENTS

| 4,524,121 A | * | 6/1985 | Gleim et al. ................ 430/176 |
| 5,153,773 A | * | 10/1992 | Muraki et al. .............. 359/619 |
| 5,648,857 A | * | 7/1997 | Ando et al. .................... 359/12 |
| 5,668,590 A | * | 9/1997 | Maruo et al. ................ 347/256 |
| 5,786,911 A | * | 7/1998 | Tawa et al. .................... 359/17 |
| 2002/0160314 A1 | * | 10/2002 | Lin et al. ..................... 430/322 |

FOREIGN PATENT DOCUMENTS

JP          61-267946         * 11/1986     ........... G11B/7/135

* cited by examiner

*Primary Examiner*—Mark F. Huff
*Assistant Examiner*—Nicole Barreca
(74) *Attorney, Agent, or Firm*—Winston Hsu

(57) ABSTRACT

A photoresist layer comprising an optically active component is provided, so that after an incident linearly polarized light penetrates the photoresist layer, the intensity ratio of an S wave polarization and a P wave polarization divided from the linearly polarized light is effectively 1:1 so improving astigmatism.

14 Claims, 7 Drawing Sheets

(S)-(+)-2-butanol (R)-(−)-epinephrine (R)-(−)-2-butanol (S)-(+)-epinephrine thyroid hormone (S)

(+)-carvone wrong enantiomer (R)

(−)-carvone

METHOD OF IMPROVING ASTIGMATISM OF A PHOTORESIST LAYER

FIELD OF THE INVENTION

The present invention relates to a method of adjusting the polarization intensity for high numerical apertures (NA), and more particularly, to a method of adjusting the intensity ratio of an S wave polarization to a P wave polarization after penetrating a photoresist layer to a predetermined depth.

DESCRIPTION OF THE PRIOR ART

The photolithography process is very important in the field of semiconductor manufacturing. The definition of each thin film, the interconnects, the doped areas, etc. are controlled by the photolithography process. The photolithography process is very complicated, including the coating of a photoresist layer, an exposure process, a development process, etc. Since the patterns of the mask must be transferred to the semiconductor wafer, the quality of the photolithography process is decisive to the product yield.

FIG. 1 is a schematic diagram of an exposure light source emitting light. During a photolithography process, an incident linearly polarized light 10 penetrates a photoresist layer 12 through a reduction lens (not shown) of high numerical aperture (NA), and has an incident angle θ. The incident linearly polarized light 10 is divided into an S wave polarization 14 and a P wave polarization 16, which are orthogonal. The S wave polarization 14 has an electric field 18 and a magnetic field 20, and the P wave polarization has an electric field 22 and a magnetic field 24 wherein the electric field 18 is perpendicular to the electric field 22.

FIG. 2 shows the transmission coefficients of the S wave polarization and the P wave polarization for the photoresist layer according to the prior art. As shown in FIG. 2, using NA=sin θ (where θ is the incident angle), when the NA of the reduction lens is more than 0.7, the incident angle θ is more than $\sin^{-1} 0.7$, and the S wave polarization 14 has a transmission coefficient for the photoresist layer 12 that is different from the P wave polarization.

Since the S wave polarization 14 and the P wave polarization 16 have different transmission coefficients for the photoresist layer 12, the intensity ratio of the S wave polarization 14 to the P wave polarization after penetrating the photoresist layer 12 is not 1:1. Following this, due to the intensity ratio not being 1:1, the exposure effect along the perpendicular direction and the parallel direction of the patterns is not equal. This then causes astigmatism.

Astigmatism affects the fidelity of the parallel direction and the perpendicular direction of the patterns, and affects the exposure process greatly. Moreover, all the photolithography processes for high NA have similar problems.

SUMMARY OF THE INVENTION

It is therefore an objective of the present invention to provide a method of improving astigmatism of the photoresist layer.

It is another objective of the present invention to provide a method of adjusting the intensity of the polarization for high NA.

The preferred embodiment of the present invention provides an exposure system comprising a light source to provide light, a mask comprising a mask pattern, the light capable of passing through the mask pattern, a photoresist layer comprising an optically active component, a reduction lens system adapted to accept light passing through the mask to form an image in the photoresist layer, and a linear polarizer positioned between the light source and the photoresist layer to linearly polarize the light from the light source. The optically active component divides linearly polarized light into an intensity-adjusted S wave polarization and an intensity-adjusted P wave polarization. The proportion of the intensity of the S wave polarization to the P wave polarization is effectively 1:1 after penetrating the photoresist layer to a predetermined depth.

It is an advantage of the present invention that it can improve astigmatism of all exposure processes having high NA.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
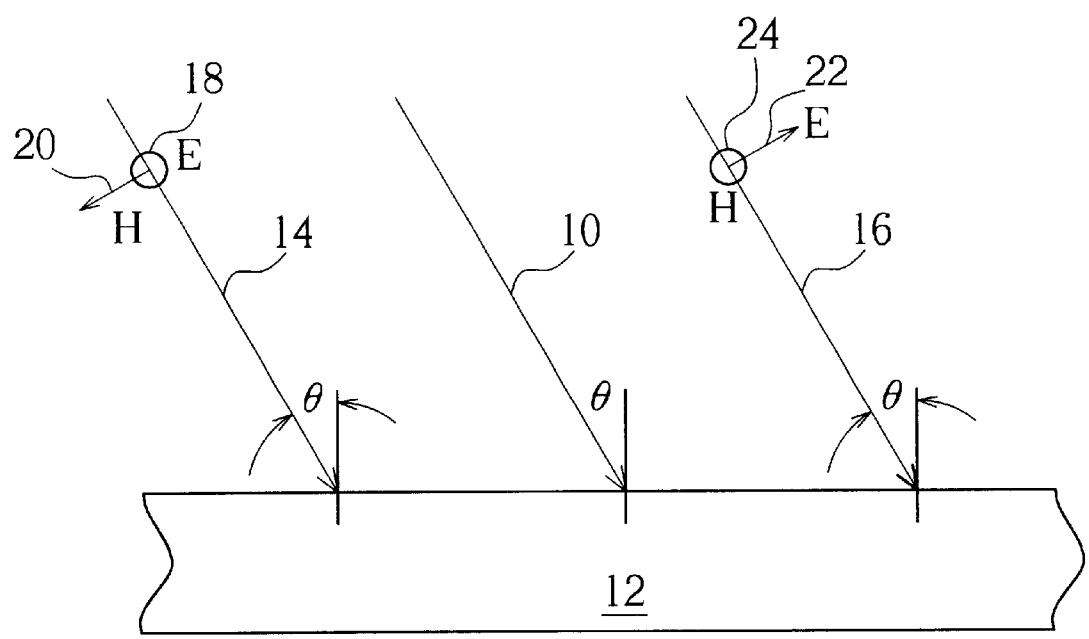
FIG. 1 is a schematic diagram of an exposure light source emitting light.
Figure 2:
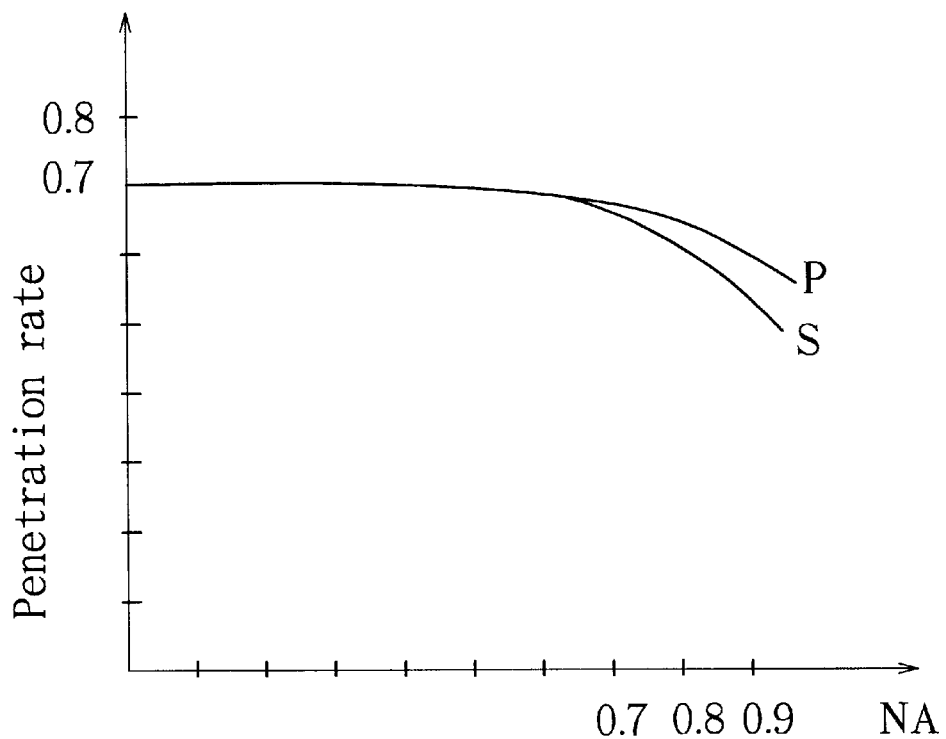
FIG. 2 are transmission coefficients of an S wave polarization and a P wave polarization for a photoresist layer according to the prior art.
Figure 3:
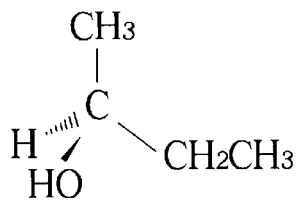
FIG. 3 shows the molecular structures of an optically active component of the present invention
Figure 3:
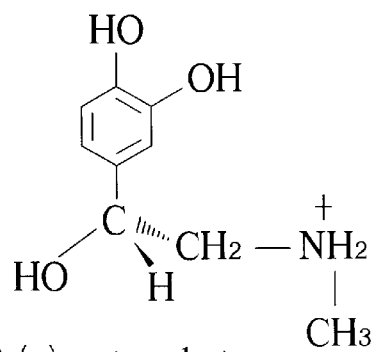
Figure 3:
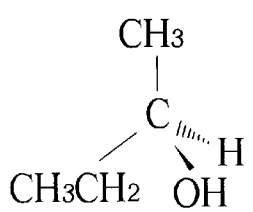
Figure 3:
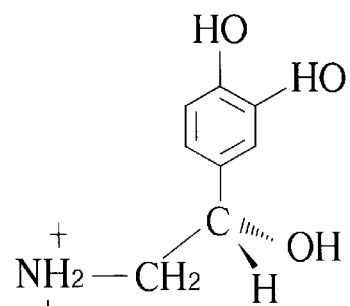
Figure 3:
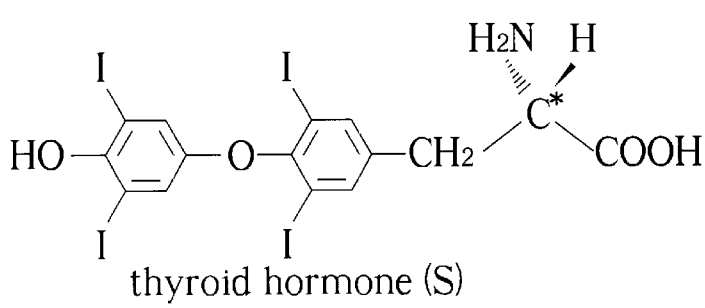
Figure 3:
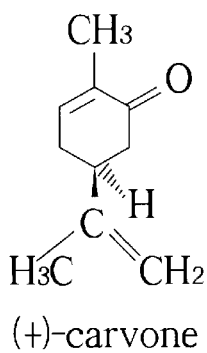
Figure 3:
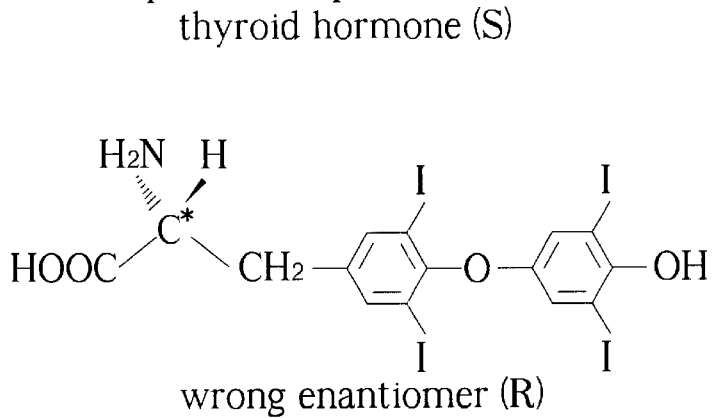
Figure 3:
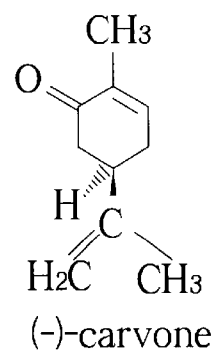

The present invention provides a reagent 30 of an optically active component of a photoresist layer 32 to divide linearly polarized light 40 into an intensity-adjusted S wave polarization 42 and an intensity-adjusted P wave polarization 44 so that the intensity ratio of the S wave polarization 42 to the P wave polarization 44 is effectively 1:1, after penetrating the photoresist layer 32 to a predetermined depth. The optically active component comprises one compound, or a combined compound selected from a group consisting of (S)-(+)-2-butanol, (R)-(−)-2-butanol, (R)-(−)-epinephrine, (S)-(+)-epinephrine, thyroid hormones(S), wrong enantiomer (R), (+)-carvone, (−)-carvone or anything else having optical activity. The molecular structures of the above-mentioned compound are shown in FIG. 3.

Figure 4:
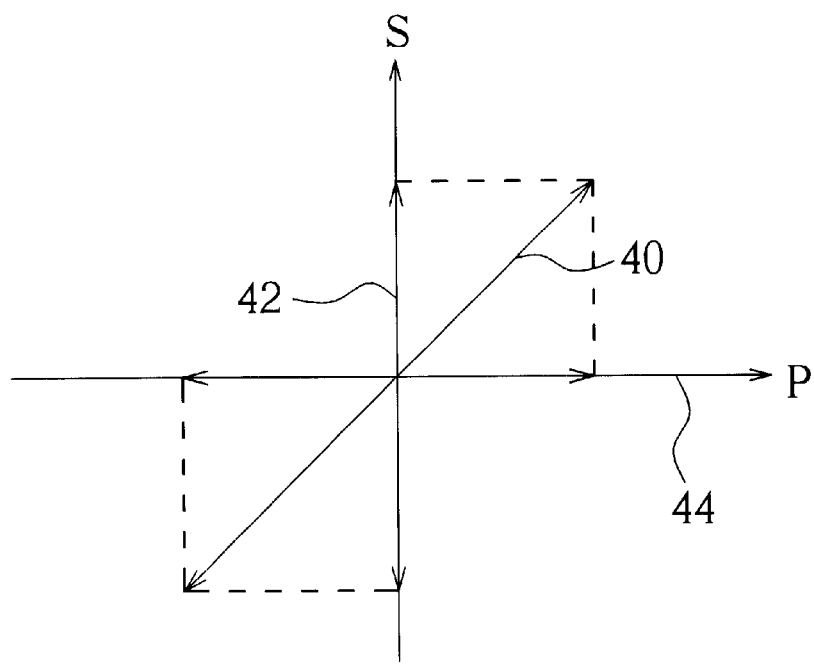
FIG. 4 to FIG. 8 are schematic diagrams of the present invention.

FIG. 4 to FIG. 8 are schematic diagrams of the principles of the present invention. As shown in FIG. 4, the linearly polarized light 40 is divided into the orthogonal S wave polarization 42 and the P wave polarization 44, and the intensity of the linearly polarized light 40 is the sum of the S wave polarization 42 and the P wave polarization 44.

Figure 5:
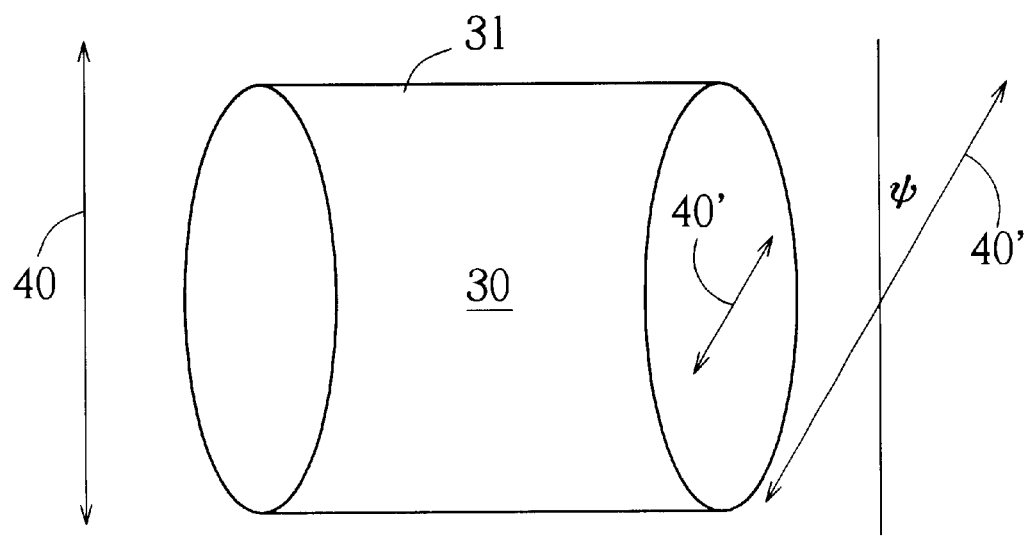

As shown in FIG. 5, optical activity is a property allowing a polarized light to be rotated. If the linearly polarized light 40 vibrating in the vertical plane passes through a transparent container 30 loaded with the reagent comprising optically active component 31, the linearly polarized light 40 emerges with its plane of vibration rotated by an angle φ and becomes a linearly polarized light 40'.

Figure 6:
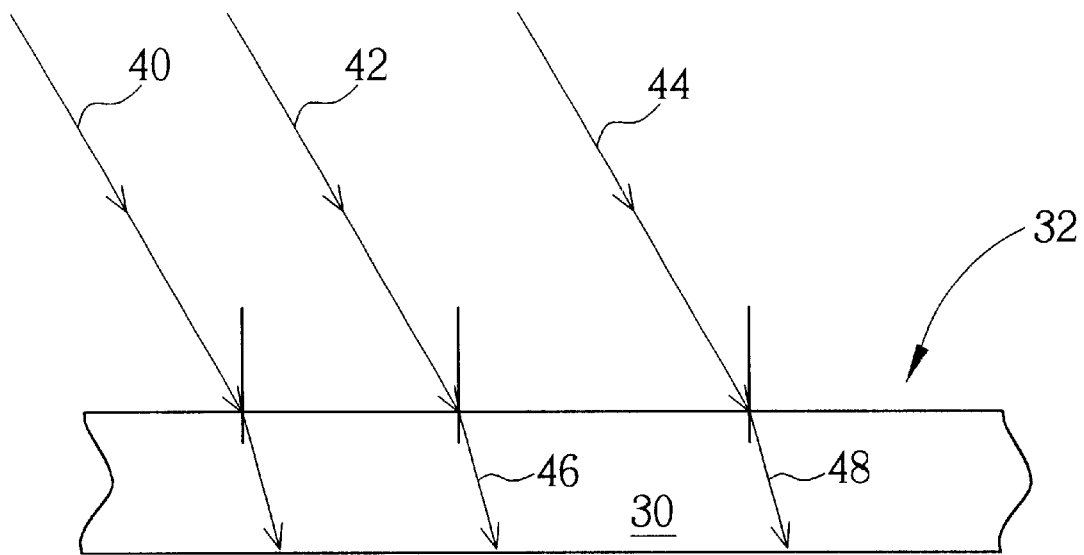
Figure 7:
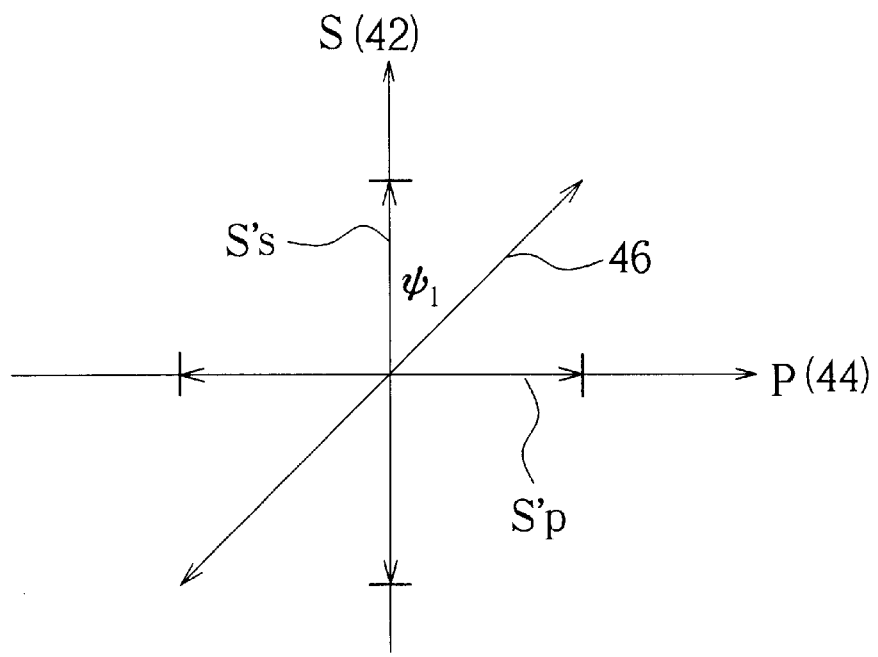

As shown in FIG. 6, the linearly polarized light 40 penetrates the photoresist layer 32. The linearly polarized light 40 has been divided into the S wave polarization 42 and the P wave polarization 44. Following that, the S wave polarization 42 and the P wave polarization 44 penetrate the photoresist layer 32, the reagent 30 of an optically active component of the photoresist layer 32 rotates the S wave polarization 42 by an angle $\phi_1$, and then an S' wave polarization 46 is formed. The P wave polarization 44 is rotated by $\phi_2$ also, leading to a P' wave polarization 48 being formed. As shown in FIG. 7, the S' wave polarization 46 is divided into two orthogonal polarized lights. One of the two orthogonal polarized lights results in a component $S'_P$ aligned in a parallel manner with the P wave polarization 44, wherein the component $S'_P$ becomes an $S'_P$ wave polarization. The other of the two orthogonal polarized lights results in a component $S'_S$ aligned in a parallel manner with the S wave polarization 42, wherein the component $S'_S$ becomes an $S'_S$ wave polarization. The intensity of the S' wave polarization 46 is the sum of the $S'_P$ wave polarization and the $S'_S$ wave polarization. By rotating the S wave polarization 42 by $\phi_1$ to form the S' wave polarization 46, the intensity is aligned in a parallel manner, with the P wave polarization 44 and the S wave polarization 42 thereby changed.

Figure 8:
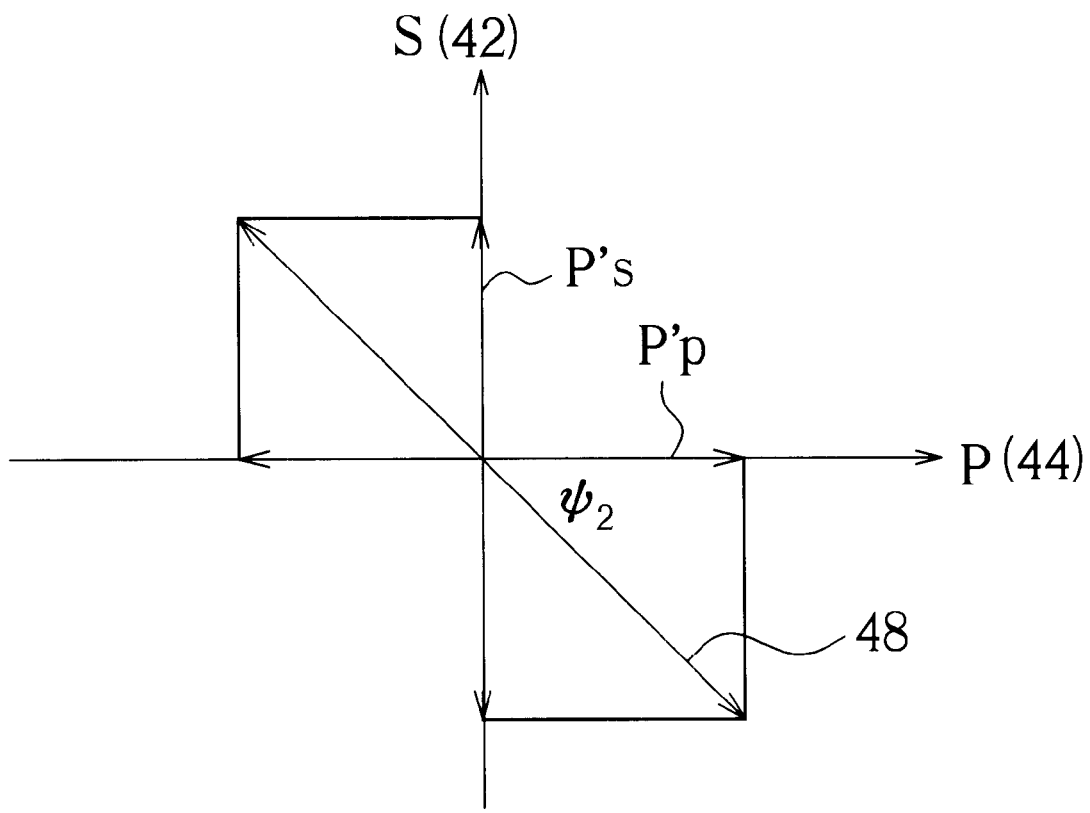

As shown in FIG. 8, the reagent 30 (not shown) of the photoresist layer 32 also rotates the P wave polarization 44 by $\phi_2$ to form a P' wave polarization 48, with the P' wave polarization 48 divided into a $P'_P$ wave polarization and a $P'_S$ wave polarization. The intensity is aligned in a parallel manner, with the P wave polarization 44 and the S wave polarization 42 thereby changed. Moreover, the fact that the molecular structure of the photoresist 32 absorbs a portion of any polarized light after penetrating the photoresist layer 32 to a predetermined depth decreases the intensity of the polarized light, should be taken into account.

Figure 9:
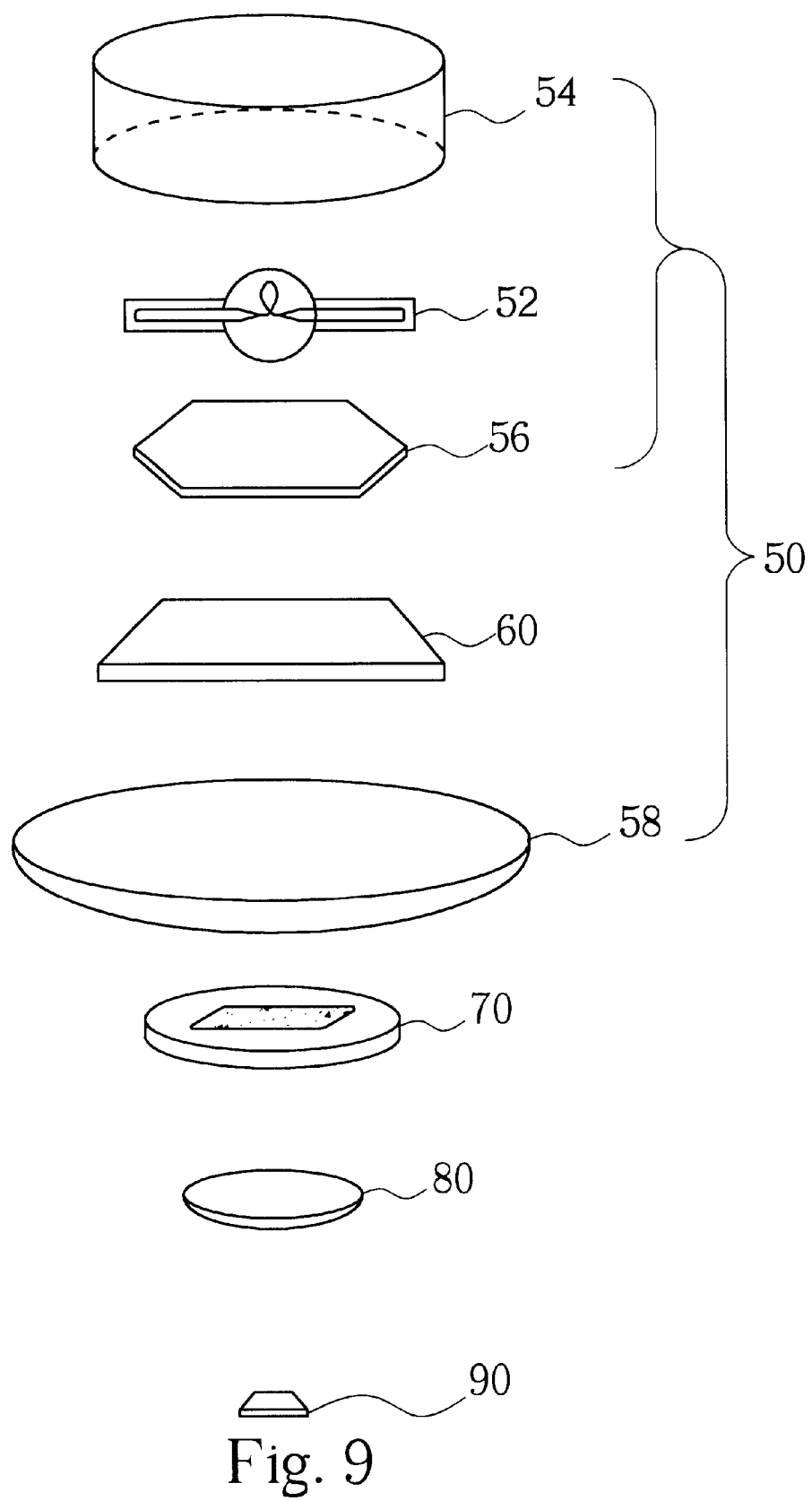
FIG. 9 to FIG. 10 are schematic diagrams of a first embodiment of the present invention.
Figure 10:
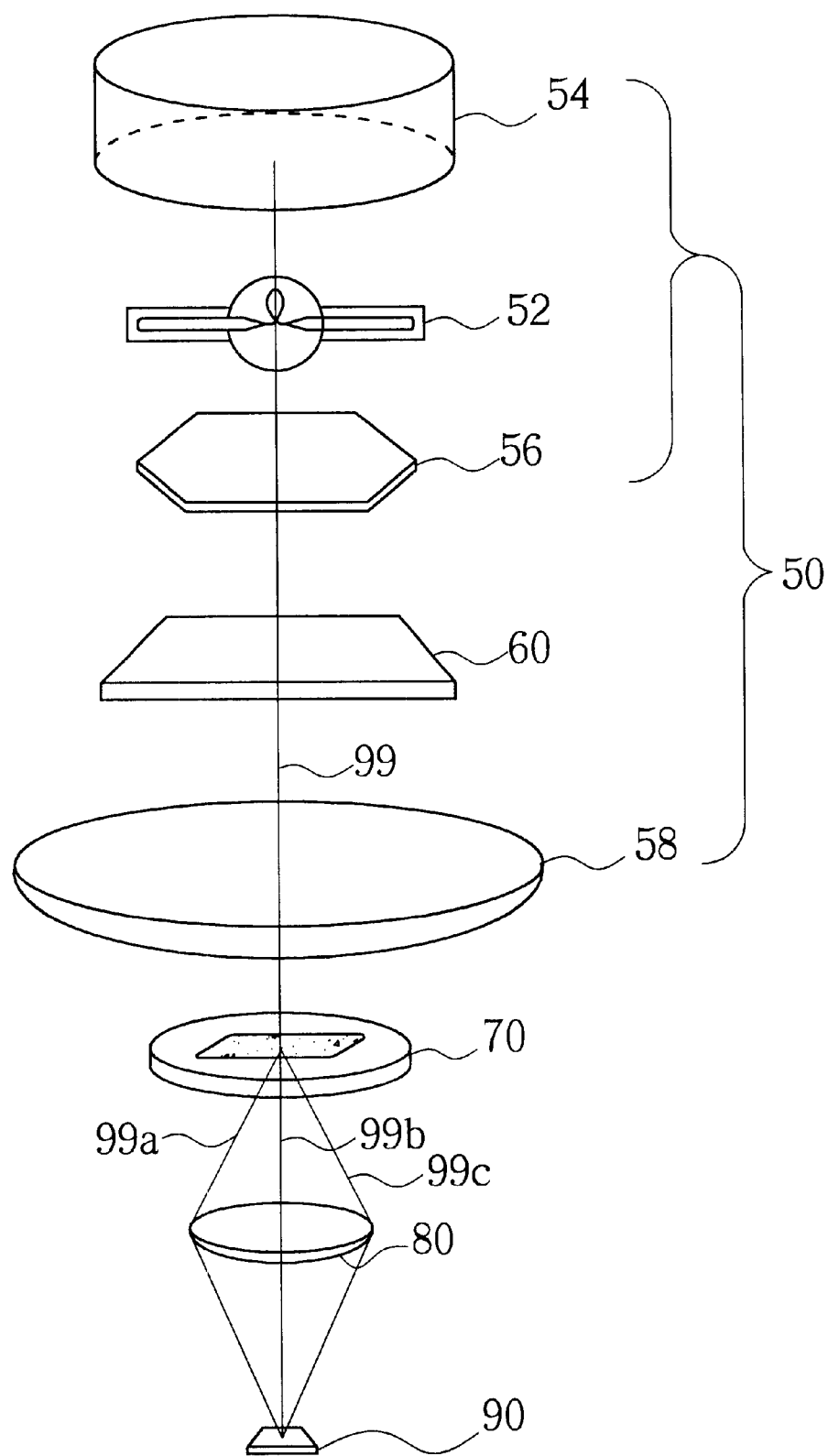

FIG. 9 and FIG. 10 are schematic diagrams of the first embodiment of the present invention. As shown in FIG. 9, the present invention provides an exposure system 50 comprising a mercury arc lamp 52 to function as a light source, a mirror 54 positioned in back of the mercury arc lamp 52, a filter 56 positioned in front of the mercury arc lamp 52, a linear polarizer 60 positioned in front of the filter 56, a condenser lens system 58 positioned in front of the linear polarizer 60, a mask 70 comprising a mask pattern positioned in front of the condenser lens system 58, a reduction lens system 80 of high NA (NA>0.7) positioned in front of the mask 70 to collect the light to form an image in a photoresist layer 90 that is coated on a semiconductor wafer (not shown), wherein the photoresist layer 90 comprises the regent 30 of an optically active component. Moreover, the photoresist layer 90 comprises a resin, a sensitizer, and a solvent (all not shown).

As shown in FIG. 10, the present invention provides the mercury arc lamp 52 as a light 99, with a portion of the light 99 passing through the filter 56, and the other portion of the light 99 from the mercury arc lamp 52 being reflected by the mirror 54 and still passing through the filter 56. After passing through the filter 56, the light 99 is circularly polarized or elliptically polarized depending on what kind of filter filter 56 is. The light 99 that is circularly polarized or elliptically polarized passes through the linear polarizer 60 and becomes a linearly polarized light.

After the light 99 passes through the mask 70, it is divided into at least two lights 99a, 99b, and 99c. Then, the light 99a, 99b, 99c passes through the reduction lens system 80 comprising a focusing lens of high NA (NA>0.7) to collect the light 99a, 99b, 99c to form an image on the photoresist layer 90, with the thickness of the photoresist layer 90 being approximately 0.6 to 1.0 $\mu$m.

When the incident angle $\theta$ is not less than $\sin^{-1} 0.7$, the S wave polarization of the light 99a, 99b, 99c has a transmission coefficient for the photoresist layer 90 that is different from the P wave polarization of the light 99a, 99b, 99c. By using the photoresist layer 90 comprising the reagent 30, the intensity ratio of the S wave polarization to the P wave polarization is 1:1 after the light 99a, 99b, 99c penetrates the photoresist layer 90 to a predetermined depth. The resulting astigmatism caused by the intensity ratio not being equal to 1:1 is thereby solved.

The second embodiment of the present invention is to combine the molecular structure shown in FIG. 3 in any ratio. For example, if 100% thyroid hormones (S) is allowed to rotate the linearly polarized light to the left, and 100% wrong enantiomer(R) is allowed to rotate the linearly polarized light to the right, the optical activity of the mixture of both thyroid hormones(S) and enantiomer(R) is:

$$|R-S|/(R+S) \%$$

wherein R represents the concentration of the wrong enantiomer(R) in the regent, and S represents the concentration of the thyroid hormones(S). The direction of the rotation depends on the relative concentration of R to S. If R is more than S, the linearly polarized light rotates to the right, and vice versa. The above mentioned formula applies to (+) or (−), or (R), (S), (+), (−).

The third embodiment of the present invention involves loading a transparent container with the reagent of optically active component, and positioning the transparent container in front of the linear polarizer. The transparent container is a quartz container.

In contrast to prior art, the present invention uses a regent of optically active component to adjust the intensity of a P wave polarization and an S wave polarization so that the intensity ratio of the S wave polarization and the P wave polarization is 1:1 after penetration through a photoresist layer, thus improving astigmatism in the photoresist layer. The present invention can thus solve astigmatism for high NA during any exposure process.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of improving astigmatism of a photoresist layer, the method comprising:

providing an exposure system comprising a light source to provide light;

providing a mask comprising a mask pattern, the light capable of passing through the mask pattern;

providing a photoresist layer comprising an optically active component, the optically active component comprising (S)-(+)-2-butanol, (R)-(−)-2-butanol, (R)-(−)-epinephrine, (S)-(+)-epinephrine, thyroid hormones(S), (+)-carvone, or (−)-carvone;

providing a reduction lens system adapted to accept light passing through the mask to form an image in the photoresist layer; and providing a linear polarizer positioned between the light Source and the photoresist layer to linearly polarize the light from the light Source;

wherein the optically active component divides linearly polarized light into an intensity-adjusted S wave polarization and an intensity-adjusted P wave polarization, the proportion of the intensity of the S wave polarization to the P wave polarization being effectively 1:1 after penetrating the photoresist layer to a predetermined depth.

2. The method of claim 1 wherein the photoresist layer additionally comprises a resin, a sensitizer, and a solvent.

3. The method of claim 1 wherein the reduction lens system comprises a focusing lens.

4. The method of claim 3 wherein a numerical aperture (NA) of the focusing lens is not less than 0.7.

5. The method of claim 1 wherein the exposure light source system additionally comprises a reflection mirror.

6. The method of claim 5 wherein the reflection mirror reflects the light from the light source.

7. The method of claim 1 wherein the light source is a mercury arc lamp or a laser.

8. A method of improving astigmatism of a photoresist layer, the method comprising:

providing an exposure system comprising a light source to provide, light;

providing a mask comprising a mask pattern, the light capable of passing through the mask pattern;

providing a reduction lens system adapted to accept light passing through the mask to form an image in the photoresist layer;

providing a linear polarizer positioned between the light source and the photoresist layer to linearly polarize the light from the light source; and providing a transparent container loaded with a reagent comprising an optically active component positioned between the linear polarizer and the photoresist layer, the optically active component comprising (S)-(+)-2-butanol, (R)-(−)-2-butanol, (R)-(−)-epinephrine, (S)-(+)-epinephrine, thyroid hormones(S), (+)-carvone, or (−)-carvone and being adapted to divide linearly polarized light into an intensity-adjusted S wave polarization and an intensity-adjusted P wave polarization the proportion of the intensity of the S wave polarization to the P wave polarization being effectively 1:1 after penetrating the photoresist layer to a predetermined depth.

9. The method of claim 8 wherein the transparent container is a quartz container.

10. The method of claim 8 wherein the reduction lens system comprises a focusing lens.

11. The method of claim 10 wherein a numerical aperture (NA) of the focusing lens is not less than 0.7.

12. The method of claim 8 wherein the exposure system additionally comprises a reflection mirror.

13. The method of claim 12 wherein the reflection mirror reflects the light from the light source.

14. The method of claim 8 wherein the light source is a mercury arc lamp or a laser.

* * * * *